United States Patent
Nazarian et al.

(10) Patent No.: US 8,040,738 B2
(45) Date of Patent: Oct. 18, 2011

(54) METHOD AND APPARATUS FOR PERFORMING SEMICONDUCTOR MEMORY OPERATIONS

(75) Inventors: Hagop Nazarian, San Jose, CA (US);
Imran Khan, San Jose, CA (US);
Chieu-Yin Chia, San Jose, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 12/346,699

(22) Filed: Dec. 30, 2008

(65) Prior Publication Data
US 2011/0122708 A1 May 26, 2011

(51) Int. Cl.
*G11C 11/34* (2006.01)
(52) U.S. Cl. ............................. 365/185.25; 365/185.24
(58) Field of Classification Search ............. 365/185.25, 365/185.24
See application file for complete search history.

(56) References Cited

U.S. PATENT DOCUMENTS

| | | | |
|---|---|---|---|
| 6,147,925 A * | 11/2000 | Tomishima et al. | 365/230.03 |
| 6,373,746 B1 * | 4/2002 | Takeuchi et al. | 365/185.03 |
| 6,850,439 B1 * | 2/2005 | Tanaka | 365/185.17 |
| 7,177,196 B2 * | 2/2007 | Takeuchi et al. | 365/185.22 |
| 7,196,932 B2 * | 3/2007 | Takeuchi et al. | 365/185.21 |
| 7,251,161 B2 * | 7/2007 | Yano et al. | 365/185.17 |

* cited by examiner

Primary Examiner — Michael T Tran (57) ABSTRACT

A semiconductor memory device and a method for performing a memory operation in the semiconductor memory device are provided. The semiconductor memory device includes a plurality of predetermined memory arrays, a bitline decoder, and a controller. The controller provides the memory operation signal to the bitline decoder and, after precharging bitlines of the plurality of predetermined memory arrays, performs the memory operation on selected memory cells in the one or more of the plurality of predetermined memory arrays in accordance with the memory operation signal. The bitline decoder includes a plurality of sector select transistors and determines selected ones of the plurality of predetermined memory arrays and selected rows and unselected rows within the selected ones of the plurality of predetermined memory arrays in response to the memory operation signal. The bitline decoder also precharges the bitlines of the plurality of predetermined memory arrays to a first voltage potential then shuts off the sector select transistors of unselected ones of the plurality of predetermined memory arrays and the unselected rows of the selected ones of the plurality of predetermined memory arrays while maintaining the sector select transistors of the selected rows of the selected ones of the plurality of predetermined memory arrays at the first voltage potential prior to the controller performing the memory operation.

20 Claims, 6 Drawing Sheets

METHOD AND APPARATUS FOR PERFORMING SEMICONDUCTOR MEMORY OPERATIONS

FIELD OF THE INVENTION

The present invention generally relates to semiconductor memory devices, and more particularly relates to a method and an apparatus for performing memory operations in a reduced-size semiconductor memory device.

BACKGROUND OF THE DISCLOSURE

The trend in semiconductor memory devices is to constantly produce devices having more memory and/or having a smaller die size. For example, the cost of producing a semiconductor memory device, such as a Flash memory device having one or more bits in each memory cell can be reduced by reducing the size of the flash memory device die size. Typically the reduction of Flash memory device die size is accomplished by investing in a next technology lithography node. However, such investment is costly in terms of research and developments costs and time.

Conventional Flash memory devices include a plurality of memory core arrays, each memory core array including a predetermined number of memory cells for nonvolatilely storing one or more bits of information. Each of the plurality of memory core arrays includes a bitline decoder, a decoding circuit that includes arrays of sector select (SSEL) transistors. The array of SSEL transistors consumes a large amount of die space.

Thus, it is desirable to provide a method and apparatus for performing one or more memory operations which would allow for reduction in the Flash memory device die size by reducing the size of the SSEL transistors while improving their performance without changing the fabrication process of the Flash memory device or increasing the production cost thereof. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

A method is provided for performing a memory operation in a semiconductor memory device including a plurality of predetermined memory arrays. The method includes the steps of receiving a memory operation signal and determining selected ones of the plurality of predetermined memory arrays and selected rows and unselected rows within the selected ones of the plurality of predetermined memory arrays in response to the memory operation signal. The method further includes the steps of precharging bitlines of the plurality of predetermined memory arrays to a first voltage potential, then shutting off the sector select transistors of unselected ones of the plurality of predetermined memory arrays and the unselected rows of the selected ones of the plurality of predetermined memory arrays while maintaining the sector select transistors of the selected rows of the selected ones of the plurality of predetermined memory arrays at the first voltage potential, and then performing the memory operation on selected memory cells in the one or more of the plurality of predetermined memory arrays in accordance with the memory operation signal.

A semiconductor memory device is also provided. The semiconductor memory device includes a plurality of predetermined memory arrays, a bitline decoder, and a controller. The controller is coupled to the bitline decoder and the plurality of predetermined memory arrays and provides the memory operation signal to the bitline decoder and, thereafter, performs the memory operation on selected memory cells in the one or more of the plurality of predetermined memory arrays in accordance with the memory operation signal. The bitline decoder is coupled to the plurality of predetermined memory arrays and includes a plurality of sector select transistors. The bitline decoder determines selected ones of the plurality of predetermined memory arrays and selected rows and unselected rows within the selected ones of the plurality of predetermined memory arrays in response to the memory operation signal, precharges bitlines of the plurality of predetermined memory arrays to a first voltage potential then shuts off the sector select transistors of unselected ones of the plurality of predetermined memory arrays and the unselected rows of the selected ones of the plurality of predetermined memory arrays while maintaining the sector select transistors of the selected rows of the selected ones of the plurality of predetermined memory arrays at the first voltage potential prior to the controller performing the memory operation.

An electronic device is also provided. The electronic device includes a device controller for generating a memory operation signal and a semiconductor memory device coupled to the device controller and performing a memory operation in response to the memory operation signal. The semiconductor memory device includes a plurality of predetermined memory arrays, a bitline decoder, and a controller. The controller is coupled to the bitline decoder and the plurality of predetermined memory arrays and provides the memory operation signal received from the device controller to the bitline decoder and, thereafter, performs the memory operation on selected memory cells in the one or more of the plurality of predetermined memory arrays in accordance with the memory operation signal. The bitline decoder is coupled to the plurality of predetermined memory arrays and includes a plurality of sector select transistors. The bitline decoder determines selected ones of the plurality of predetermined memory arrays and selected rows and unselected rows within the selected ones of the plurality of predetermined memory arrays in response to the memory operation signal, precharges bitlines of the plurality of predetermined memory arrays to a first voltage potential then shuts off the sector select transistors of unselected ones of the plurality of predetermined memory arrays and the unselected rows of the selected ones of the plurality of predetermined memory arrays while maintaining the sector select transistors of the selected rows of the selected ones of the plurality of predetermined memory arrays at the first voltage potential prior to the controller performing the memory operation.

BRIEF DESCRIPTION OF THE DRAWINGS

The accompanying figures, where like reference numerals refer to identical or functionally similar elements throughout the separate views and which together with the detailed description below are incorporated in and form part of the specification, serve to illustrate various embodiments and to explain various principles and advantages in accordance with the present invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF THE EMBODIMENTS

The following detailed description of an embodiment or embodiments of the invention is merely exemplary in nature and is not intended to limit the invention or the application and uses of the invention. Furthermore, there is no intention to be bound by any theory presented in the preceding background or the following detailed description of the embodiments.

Figure 1:
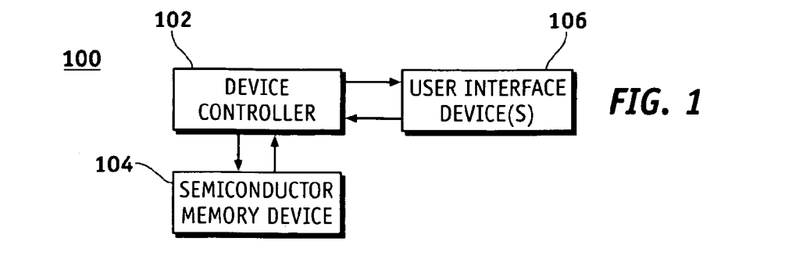
FIG. 1 is a block diagram of an electronic device incorporating a semiconductor memory device in accordance with the present invention.

Referring to FIG. 1, an electronic device 100 includes a device controller 102, a semiconductor memory device 104 and one or more user interface devices 106, such as a display, a keyboard, audio input and output devices, and/or additional input buttons and visual or audio alert elements. The device controller 102, the semiconductor memory device 104 and the user interface devices 106 are operationally coupled to each other as well as to other circuitry particular to the functions of the electronic device 100. For example, the electronic device could be capable of wireless communication, such as a cellular telephone, a cable TV setbox, or a WiFi enabled computing device, and additional circuitry would be provided for transmission and reception of radio frequency signals.

In accordance with the present embodiment, the electronic device 100 may be any electronically controlled device, such as an appliance control device, an automobile controller, a computer, a cellphone, a personal digital assistant or a MP3 player which requires nonvolatilely stored data from the semiconductor memory device 104 for operation thereof. Accordingly, the semiconductor memory device 104 is a non-volatile memory, such as a semiconductor Flash memory device, which stores data nonvolatilely in a plurality of predetermined memory arrays. During operation of the electronic device 100, the device controller 102 generates a memory operation signal and provides the memory operation signal to the semiconductor memory device 104 for performance of a memory operation such as program, read, erase or read-verify in a manner well-known to those skilled in the art.

Figure 2:
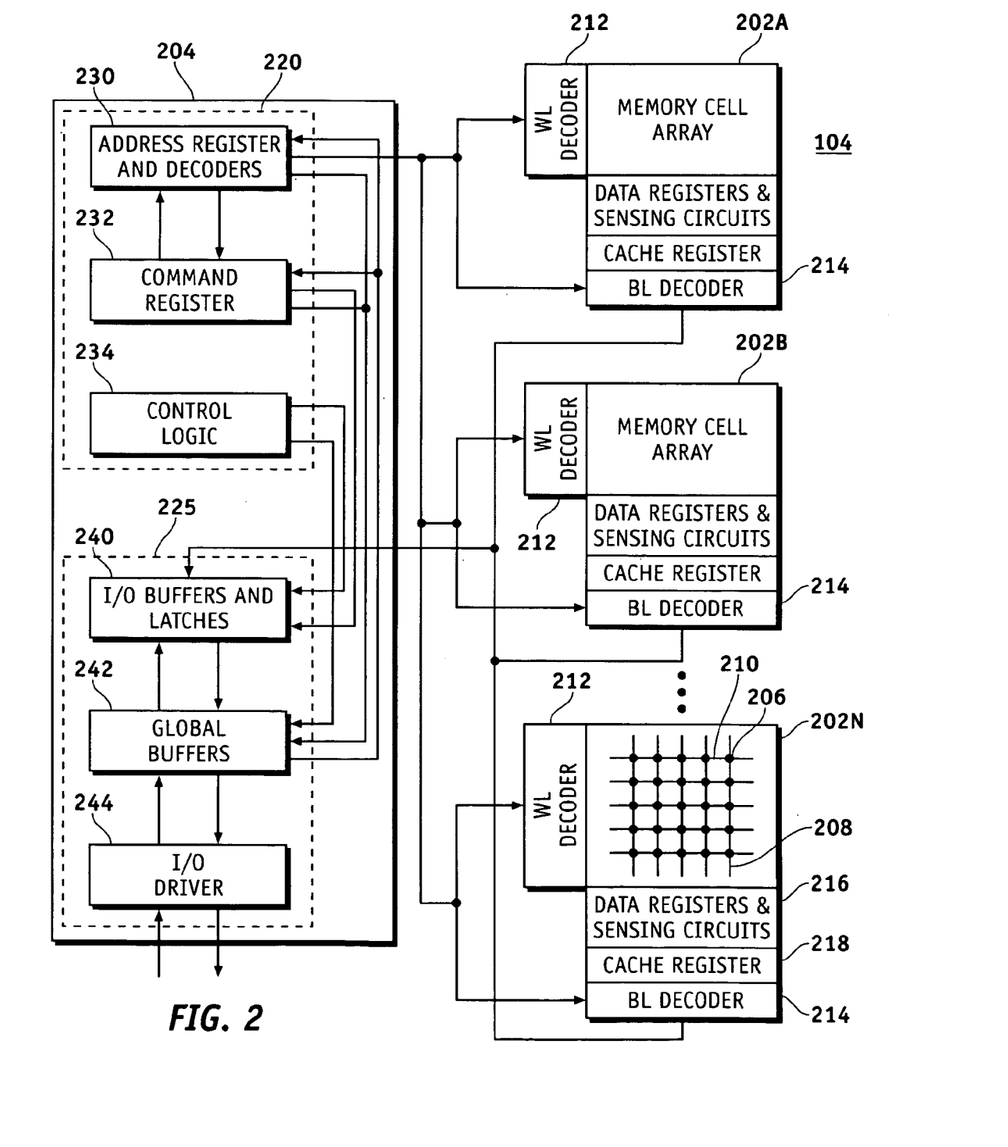
FIG. 2 is a block diagram of a semiconductor Flash memory device in accordance with the present invention.

Referring next to FIG. 2, the non-volatile semiconductor memory device 104, such as a Flash memory device, includes a plurality of predetermined memory core cell arrays 202A to 202N and a memory controller 204. As is well-known to those skilled in the art, the plurality of memory cells 206 are arranged into the plurality of predetermined memory core cell arrays 202A to 202N for efficient and fast performance of memory operations. The predetermined memory core cell arrays 202A to 202N may each consist of predefined sectors or may each be a predefined sector for performing memory operations on all portions of a sector simultaneously, such as a sector erase memory operation. Each of the predetermined memory core cell arrays 202A to 202N includes a plurality of rewritable non-volatile memory cells 206 arranged in rows 208 and columns 210 as depicted in the predetermined memory core cell array 202N for access to data within each of the memory cells 206 by an address corresponding to the memory cell 206 for performing memory operations thereon. A word line (WL) decoder 212 and a bitline (BL) decoder 214 are coupled to each of the predetermined memory core cell arrays 202A to 202N for accessing each of the plurality of memory cells 206 therein, the WL decoder 212 accessing the columns 210 and the BL decoder 214 accessing the rows 208. A data register and sensing circuit 216 and a cache register 218 are also coupled to the rows 208 of each of the predetermined memory core cell arrays 202A to 202N for performing memory operations such as programming data into or reading out data stored in the memory cells 206.

The memory controller 204 includes a control portion 220 and a data handling portion 225. The control portion 220 of the memory controller 204 includes an address register and decoder 230, a command register 232, and control logic 234 such as a state machine. The data handling portion 225 includes input/output (I/O) buffers and latches 240, a global buffer 242, and an input/output (I/O) driver 244. The state machine 220 controls the operation of each circuit in the semiconductor memory device 104 in response to control signals shared therebetween.

The input/output driver 244 interfaces the semiconductor memory device 104 with the device controller 102 (FIG. 1). The command register 232 temporarily stores memory operation signals that are received from the device controller 102 through the I/O driver 244 and the global buffer 242. The address register and decoder 230 receives from the command register 232 and decodes address portions of the memory operation signals to determine selected ones of the plurality of predetermined memory arrays 202A to 202N and selected and unselected rows 208 within the selected ones of the plurality of predetermined memory arrays in response to the address portions of the memory operation signals. The address register and decoder 230 then forwards signals to the WL decoders 212 and the BL decoders 214 of the plurality of predetermined memory arrays 202A to 202N in accordance with the determination of the selected ones of the plurality of predetermined memory arrays 202A to 202N and selected and unselected rows 208 within the selected ones of the plurality of predetermined memory arrays.

As can be seen from FIG. 2, the die of the semiconductor Flash memory device 104 consists of many repeating memory core cell arrays 202A to 202N for nonvolatilely retaining data. Reduction in the size of the memory core cell arrays 202A to 202N directly reduces the die size and hence the cost of production. Each of the memory core cell arrays 202A to 202N has a bitline (BL) decoder 214 associated therewith that consists of arrays of sector select transistors (SSEL). The SSEL transistors impact both the performance and speed of the die as well as the size of the die. General scaling to reduce the size of the SSEL requires process changes which reduce the die size but result in an increase in the process or production cost. In accordance with the present embodiment, the size of the SSEL transistors are reduced and the performance of the SSEL transistors and the performance of each of the memory core cell arrays 202A to 202N is improved without a change in the fabrication process of the semiconductor memory device or an increase in the production cost.

A major challenge faced in scaling the SSEL transistors of the BL decoder 214 is short channel effects (SCE). These effects manifest electrically in the form of decreased threshold voltage control and the accompanying exponential increase in SSEL transistor leakages. The SSEL transistors serve dual purposes: (a) to pass the electrical signal to the memory cell 206 with the least amount of distortion in the "selected case" and (b) to isolate the memory cell 206 from electrical interference in the "unselected case". The SCE associated with smaller SSEL transistors degrades the ability of the SSEL transistors to isolate the memory cell 206 from the electrical signal in the unselected case. On the device physics level, the source to channel energy barrier in the SSEL transistors is reduced when there is strong SCE, thereby resulting in unwanted exchange of electrical signals. In accordance with the present embodiment, a method is hereinafter disclosed to obtain a sufficiently high energy barrier between the source and channel of the SSEL transistors so that the SCE influence is mitigated without a change in the process flow or cost of production. Thus, shorter and smaller SSEL transistors can be employed for the BL decoders 214 of the present embodiment.

Figure 3:
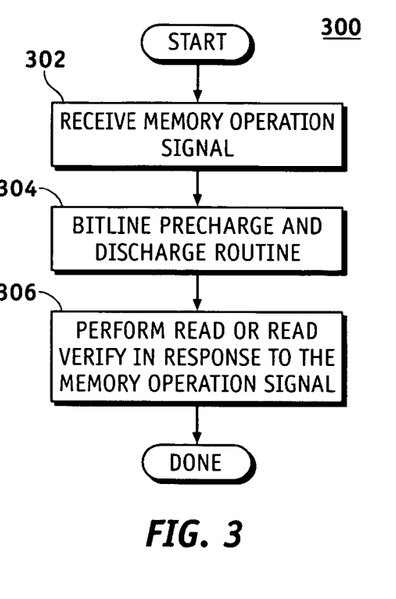
FIG. 3 is a flowchart of a read and a read-verify operation of the semiconductor Flash memory device of FIG. 2 in accordance with the present invention.

Referring to FIG. 3, a flowchart 300 of a read and a read-verify operation of the semiconductor Flash memory device 104 in accordance with the present invention begins upon reception 302 of a memory operation signal from the device controller 102. Prior to performing a memory operation, a bitline precharge and discharge routine in accordance with the present embodiment is performed 304 as described in detail later. After performing the bitline precharge and discharge routine 304, the memory read or memory read-verify operation is performed 306 in response to the memory operation signal.

Figure 4:
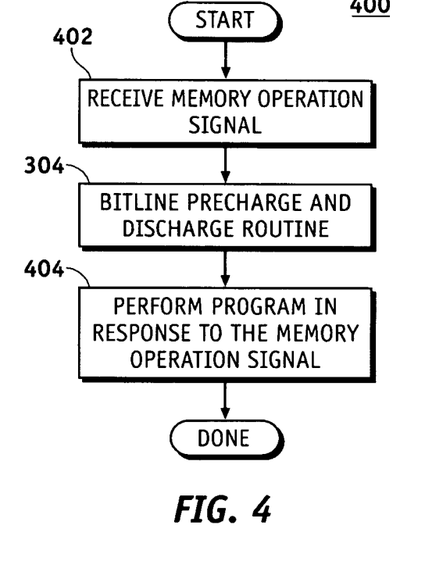
FIG. 4 is a flowchart of a program operation of the semiconductor Flash memory device of FIG. 2 in accordance with the present invention.

Referring to FIG. 4, a similar flowchart 400 depicts a program operation of the semiconductor Flash memory device 104 in accordance with the present invention. When a memory operation signal is received 402 from the device controller 102, the bitline precharge and discharge routine in accordance with the present embodiment is performed 304. After performing the bitline precharge and discharge routine 304, the memory program operation is performed 405 in response to the memory operation signal.

The bitline precharge and discharge routine 304 in accordance with the present embodiment obtains a sufficiently high energy barrier between the source and channel of the SSEL transistors so that the SCE influence is mitigated without a change in the process flow or cost of production. The higher energy barrier is accomplished by employing a bitline decoding scheme where the source of the SSEL transistors in the unselected case can be precharged to a nominal voltage. Following precharge, the SSEL transistors do not exhibit SCE effects which manifest in the form of high transistor off-state leakages. The bit line precharge and discharge routine 304 involves charging the unselected bitlines to a nominal voltage before the advent of the desired Flash memory operation.

Figure 5:
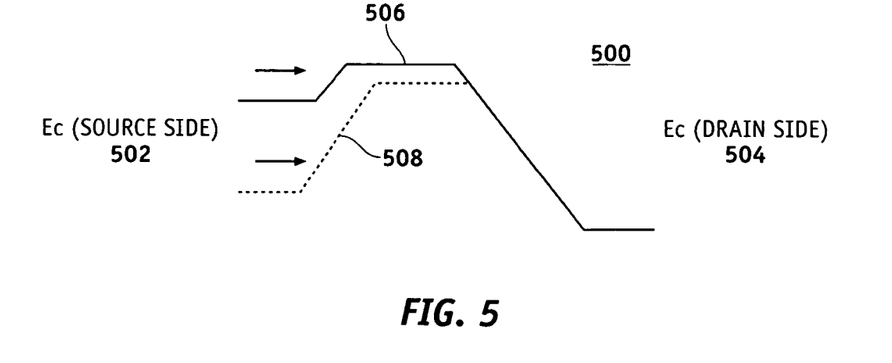
FIG. 5 is an energy band diagram illustrating device level source and drain side energies of sector select (SSEL) transistors of a bitline decoder of the semiconductor Flash memory device of FIG. 2 during the memory operations of FIGS. 3 and 4 in accordance with the present invention.

Referring to FIG. 5, an energy band diagram 500 illustrates electron barriers at the device level for current flow from SSEL transistor source 502 to drain 504 with (on line 506) and without (on line 508) precharging the unselected bitlines to a nominal voltage before the advent of the desired Flash memory operation. For example, on line 506, no source bias need be provided on the source side 502 due to precharging to an increased energy barrier, resulting in a smaller barrier for electrons. Without precharging on line 508, source bias is required to overcome the barrier provided for the electrons. As can be seen from the energy band diagram 500, the electron barrier is reduced with precharging resulting in a shorter SSEL transistor with no source bias required. Thus, in addition to die size reduction, the shorter SSEL transistor has a higher transconductance, and hence a higher drive performance. The higher drive performance ensures less distortion of the electrical signal as it is passed to the selected memory cell(s) 206, thus allowing the semiconductor memory device 104 to perform the memory operations of flowcharts 300 and 400 at higher speeds.

Figure 6:
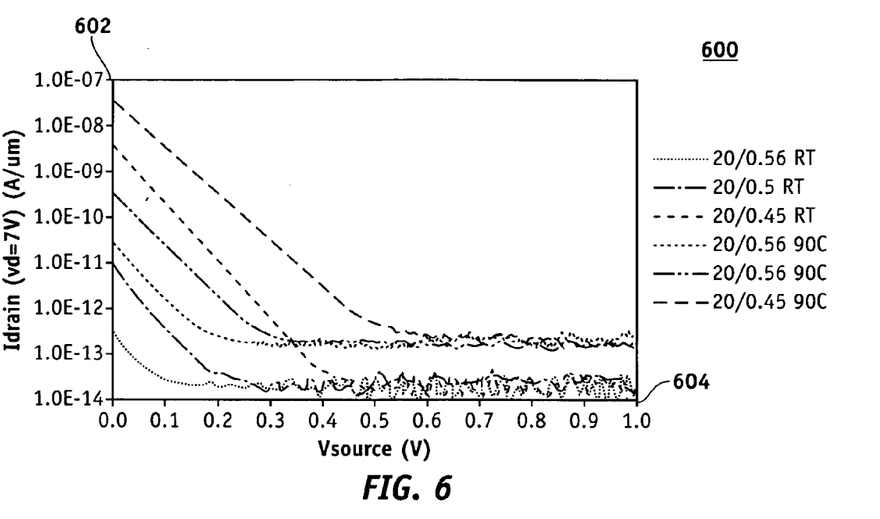
FIG. 6 is a graph depicting the effect of source bias voltage versus drain current of the SSEL transistors of the bitline decoder of the semiconductor Flash memory device of FIG. 2 in accordance with the present invention.

Referring to FIG. 6, a graph 600 depicts the effect of source bias voltage versus drain current flow of the SSEL transistors of the bitline decoders 214 in accordance with the present embodiment. The drain current concentration 602 is plotted as a function of the source voltage 604 at various temperatures (room temperature and ninety degrees Centigrade) and various ratios of channel width to channel length of the SSEL transistors (e.g., 20 um channel width/0.56 um channel length, 20 um channel width/0.5 um channel length, 20 um channel width/0.45 um channel length). Thus, it can be seen from graph 600 that, in accordance with the present embodiment, a beneficial impact of reduced transistor leakage can be provided by increasing the energy barrier from the source side by precharging the bitline or the source of the SSEL transistor before the advent of the desired Flash memory operation.

Figure 7:
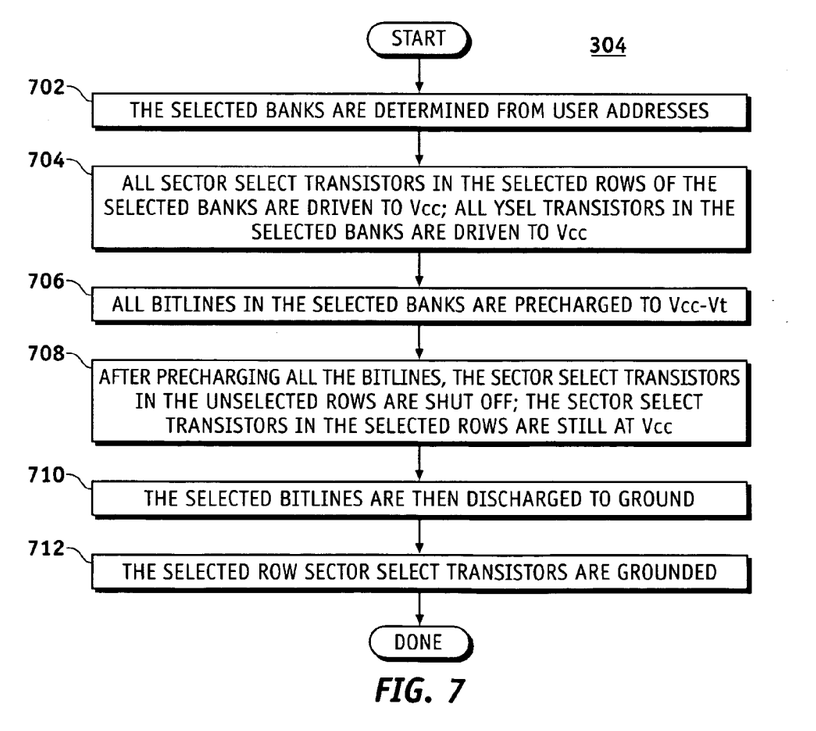
FIG. 7 is a flowchart of the bitline precharge and discharge routines of the flowcharts of FIGS. 3 and 4 in accordance with the present invention.

Referring to FIG. 7, a flowchart depicts details of the bitline precharge and discharge routine 304 in accordance with the present embodiment. Initially, as mentioned above, the address register and decoders 230 determine 702 from the address information provided in the memory operation signal selected ones of the plurality of predetermined memory arrays (banks) 202A to 202N.

Figure 8:
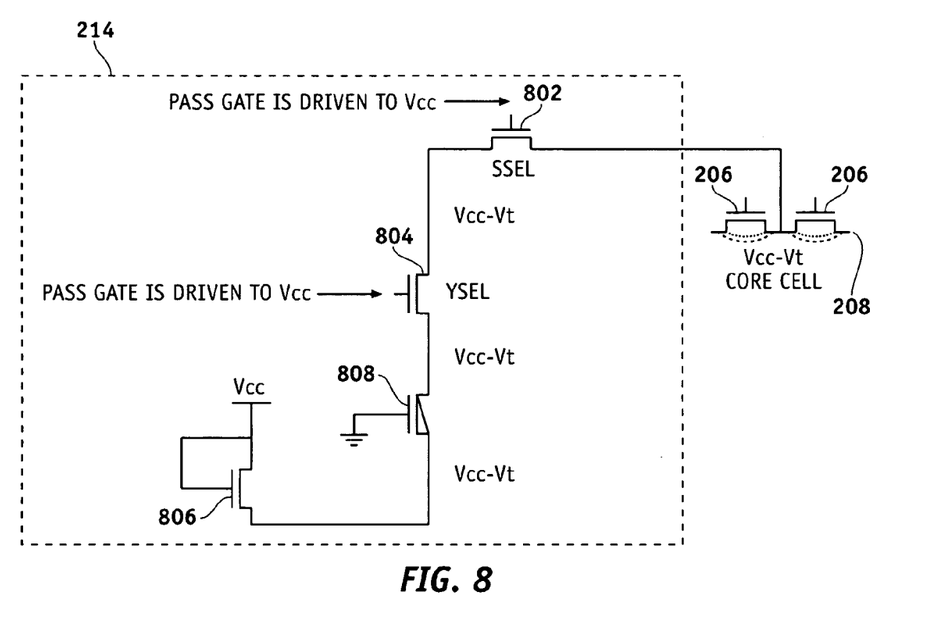
FIG. 8 is a schematic diagram of a portion of the bitline decoder of the semiconductor Flash memory device of FIG. 2 depicting the SSEL transistors thereof during a gate charging step of the bitline precharge routine of the flowchart of FIG. 5 in accordance with the embodiment of the present invention.

At step 704, the SSEL transistors and the bitline select (YSEL) transistors of the selected rows 208 of the selected ones of the plurality of predetermined memory arrays 202A to 202N in the bitline decoder 214 are driven to a first voltage potential Vcc by raising a voltage potential of gates of the SSEL and YSEL transistors to Vcc. FIG. 8 depicts a portion of the bitline decoder 214, including one of the SSEL transistors 802 and one of the YSEL transistors 804 during step 704. A first driving transistor 806 is connected to Vcc and a second driving transistor 808 has the gate grounded and is connected to YSEL transistors 804 for each of the plurality of predetermined memory arrays 202A to 202N selected in response to the memory operation signal. The YSEL transistors 804 are connected to multiple SSEL transistors 802 for selected rows 208 of the selected ones of the plurality of predetermined memory arrays 202A to 202N. In accordance with the present invention, the gates of the YSEL transistors 804 of the selected ones of the plurality of predetermined memory arrays 202A to 202N and the gates of the SSEL transistors 802 of the selected rows 208 of the plurality of predetermined memory arrays 202A to 202N are driven to Vcc at step 704 while the source and drains of the SSEL transistors 802 and the YSEL transistors 804 are floating.

Figure 9:
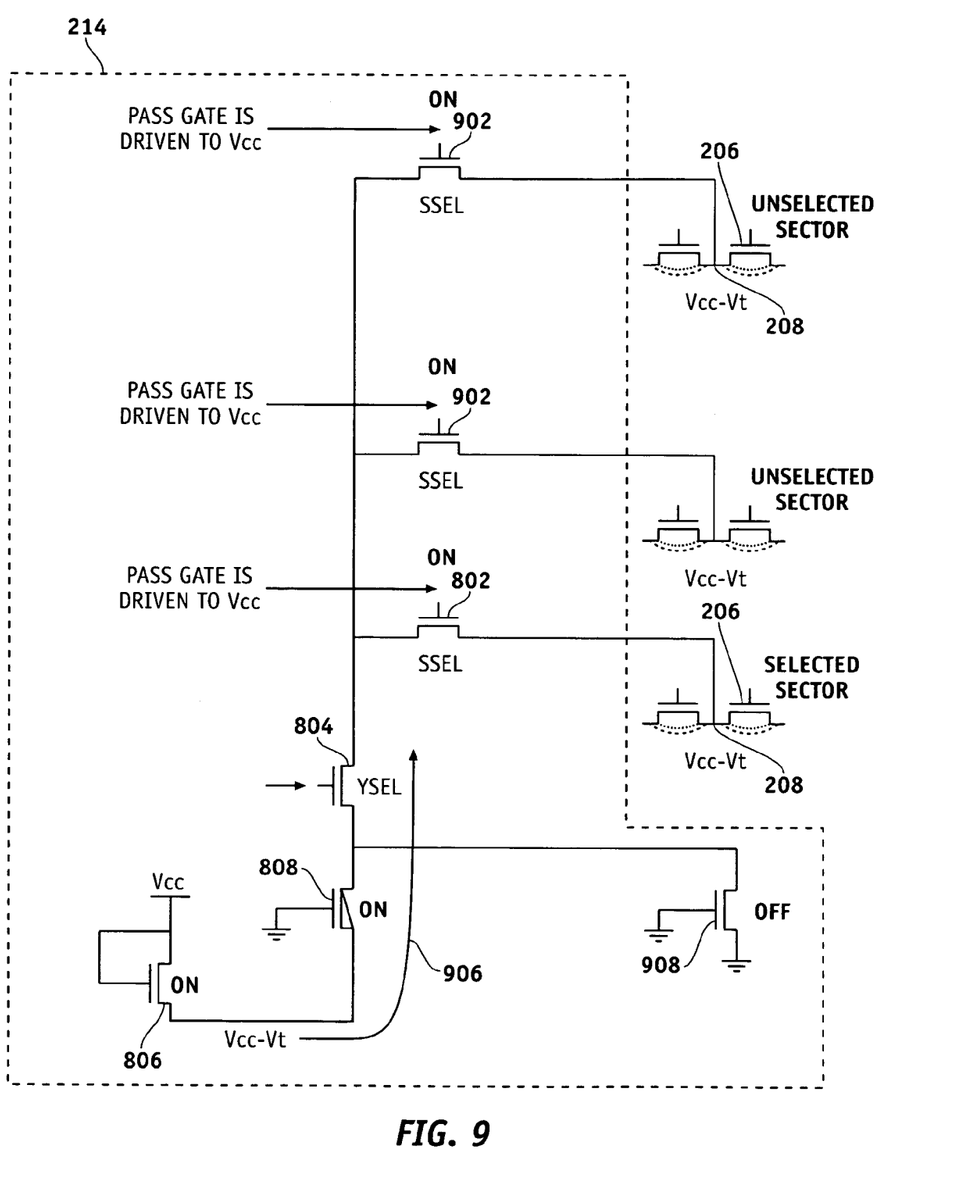
FIG. 9 is a schematic diagram of the portion of the bitline decoder of FIG. 6 depicting the SSEL transistors thereof during a precharge step of the bitline precharge routine of the flowchart of FIG. 5 in accordance with the embodiment of the present invention.

At step 706, all bitlines (i.e., the selected and unselected bitlines or rows 208 of the plurality of the selected ones of the plurality of predetermined memory arrays 202A to 202N) are precharged to a first voltage potential by precharging all YSEL transistors and all SSEL transistors in the selected ones of the plurality of predetermined memory arrays 202A to 202N. Referring to FIG. 9, precharging at step 706 is accomplished by turning ON the first driving transistor 806 and the second driving transistor 808 causing a first voltage potential, Vcc less the threshold voltage Vt of the first driving transistor 806 (shown in FIG. 9 as Vcc–Vt). Thus, by turning ON the first driving transistor 806 and the second driving transistor 808, the YSEL transistors 804 and both the selected SSEL transistors 802 and the unselected SSEL transistors 902 in the selected ones of the plurality of predetermined memory arrays 202A to 202N are precharged and the voltage potential Vcc–Vt is able to pass through the YSEL transistors 804 and both the selected SSEL transistors 802 and the unselected SSEL transistors 902 as shown by an arrow 906 because the source and drains of transistors 804, 802 and 902 are at a threshold voltage Vt below the gate voltage. A discharge transistor 908 is provided in the BL decoder 214 but is turned OFF during step 706 by grounding the gate thereof.

Figure 10:
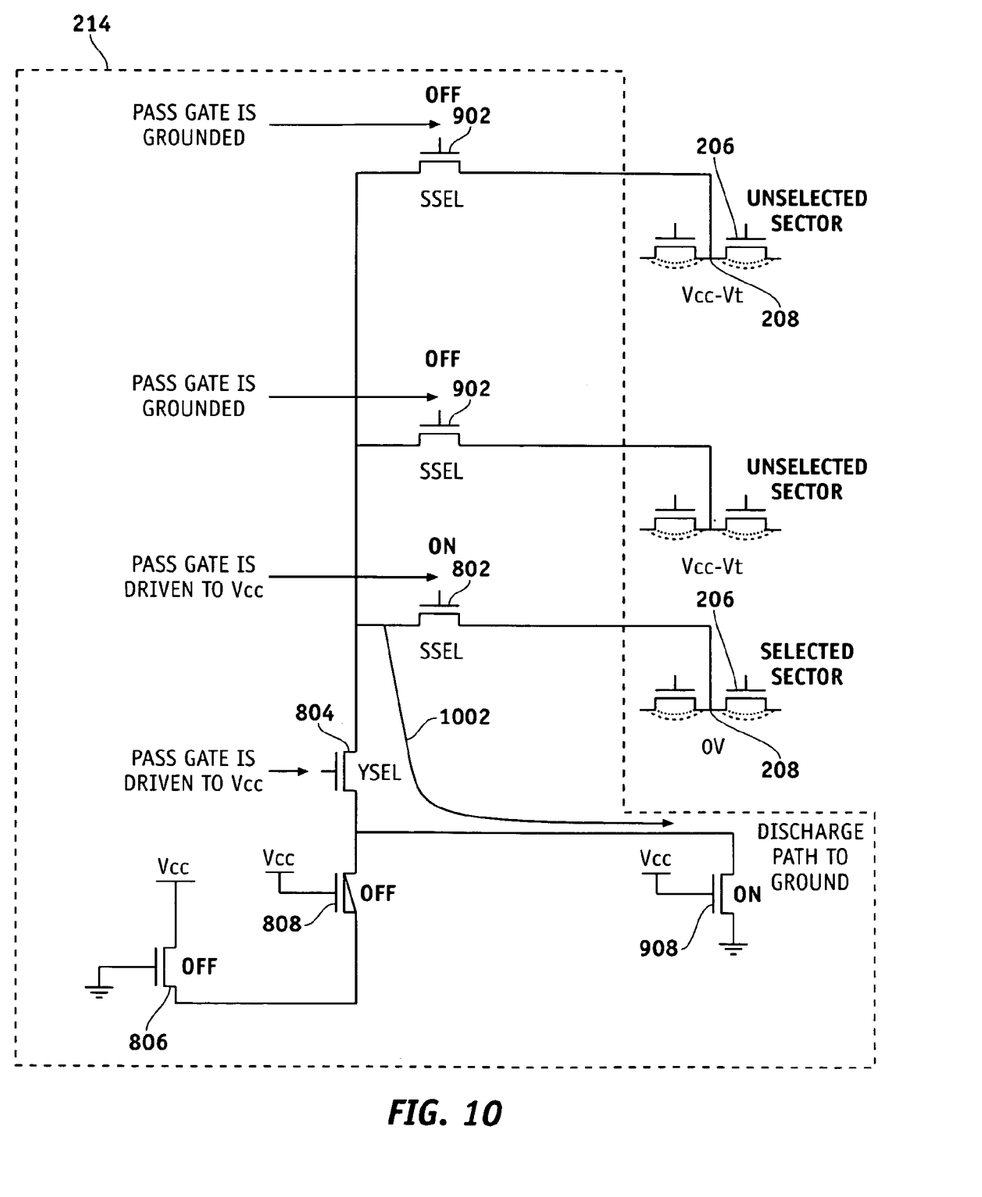
FIG. 10 is a schematic diagram of the portion of the bitline decoder of FIG. 6 depicting the SSEL transistors thereof during a discharge step of the bitline discharge routine of the flowchart of FIG. 5 in accordance with the embodiment of the present invention.

After precharging the bitlines at step 706, in step 708 the SSEL transistors 902 of unselected bitlines are shut OFF and the precharge voltage is trapped on the unselected bitlines while the selected bitlines are ON by maintaining the gates of the SSEL transistors 802 of the selected bitlines at Vcc. The SSEL transistors 802 of the selected bitlines are then discharged in step 710 to ground (i.e., a second voltage potential less than Vcc–Vt). Referring to FIG. 10, while the SSEL transistors 902 of the unselected bitlines are turned OFF, the gate of the first driving transistor 806 is grounded and Vcc is provided to the gate of the discharge transistor 908, thereby discharging the selected bitlines for the SSEL transistors 802 to ground as shown by arrow 1002. Returning to the flowchart of FIG. 7, the SSEL transistors 802 are then connected to ground at step 712 in preparation for performance of the memory operation (step 306 of FIG. 3 or step 404 of FIG. 4).

Thus it can be seen that operation in accordance with the flowchart of FIG. 7 traps a source voltage on the unselected rows of the selected ones of the plurality of predetermined memory arrays 202A to 202N) at the first potential Vcc–Vt (approximately 1.8 volts minus 1.0 volts, or 0.8 volts) to reduce the effects of drain current leakage when a voltage of seven volts is applied to the bitlines during performance of the memory operation (step 306 of FIG. 3 or step 404 of FIG. 4) that follows precharing 706 the bitlines. Referring back to FIG. 6, an Idrain for a Vsource of 0.8V will effectively reduce the leakage current at room temperature by approximately one hundred thousand times for a transistor having a ratio of channel width to channel length of 20 um/0.45 um device. Thus, operation in accordance with the flowchart of FIG. 7 reduces leakage on the SSEL transistors 902 for the unselected rows which share a common node with the SSEL transistors 802 for the selected rows. In this manner, SSEL transistor 802, 902 performance can be improved while allowing for a shorter channel length and, consequently, smaller SSEL transistors 802, 902.

Thus it can be seen that an improved method and semiconductor memory device 104 has been provided for performing memory operations wherein the smaller SSEL transistors 802, 902 provide a reduction in the semiconductor memory device 104 die size for the same technology node without changing the fabrication process of the semiconductor memory device 104 or increasing the production cost thereof. In addition, it can be seen that the improved method and semiconductor memory device 104 in accordance with the present embodiment provides improved performance by combining device physics concepts with design techniques through implementation of the precharging and discharging routine 304 in accordance with the present embodiment.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

What is claimed is:

1. A method for performing a memory operation in a semiconductor memory device including a plurality of predetermined memory arrays, the method comprising the steps of:
   receiving a memory operation signal;
   determining selected ones of the plurality of predetermined memory arrays and selected rows and unselected rows within the selected ones of the plurality of predetermined memory arrays in response to the memory operation signal;
   precharging bitlines of the plurality of predetermined memory arrays to a first voltage potential;
   after precharging to the first voltage potential, shutting off the sector select transistors of unselected ones of the plurality of predetermined memory arrays and the unselected rows of the selected ones of the plurality of predetermined memory arrays while maintaining the sector select transistors of the selected rows of the selected ones of the plurality of predetermined memory arrays at the first voltage potential; and
   performing the memory operation on selected memory cells in the one or more of the plurality of predetermined memory arrays in accordance with the memory operation signal.

2. The method in accordance with claim 1 wherein the step of precharging the bitlines further comprises the step of raising a voltage potential of gates of the sector select transistors of the plurality of predetermined memory arrays and the bit line select transistors of the selected rows of the selected ones of the plurality of predetermined memory arrays to the first voltage potential.

3. The method in accordance with claim 2 wherein the step of precharging the bitlines further comprises the step of raising a voltage potential of sources of the sector select transistors of the plurality of predetermined memory arrays and the bit line select transistors of the selected rows of the selected ones of the plurality of predetermined memory arrays to a voltage level determined in response to the first voltage potential and a threshold voltage level of the sector select transistors.

4. The method in accordance with claim 1 further comprising, after the step of performing the memory operation on the selected memory cells, the steps of:
   discharging the selected rows to a ground potential; and
   after discharging the selected rows to the ground potential, connecting the sector select transistors of the selected sector to the ground voltage potential.

5. The method in accordance with claim 1 wherein the memory operation is selected from a group of semiconductor memory operations comprising a memory read operation, a memory read-verify operation, and a program operation.

6. The method in accordance with claim 1 wherein the plurality of memory arrays comprises a plurality of memory core cell arrays.

7. The method in accordance with claim 6 wherein the plurality of memory core cell arrays comprises a plurality of predetermined memory sectors.

8. The method in accordance with claim 1 wherein the semiconductor device is a Flash memory device, and wherein the plurality of memory arrays of the Flash memory device comprise a plurality of core cell arrays, each memory cell of the plurality of core cell arrays storing one or more bits of information.

9. A semiconductor memory device comprising:
   a plurality of predetermined memory arrays;
   a bitline decoder coupled to the plurality of predetermined memory arrays and including a plurality of sector select transistors, wherein the bitline decoder determines selected ones of the plurality of predetermined memory arrays and selected rows and unselected rows within the selected ones of the plurality of predetermined memory arrays in response to a memory operation signal received thereby, and wherein the bitline decoder precharges bitlines of the plurality of predetermined memory arrays to a first voltage potential and, after precharging to the first voltage potential, shuts off the sector select transistors of unselected ones of the plurality of predetermined memory arrays and the unselected rows of the selected ones of the plurality of predetermined memory arrays while maintaining the sector select transistors of the selected rows of the selected ones of the plurality of predetermined memory arrays at the first voltage potential; and
   a controller coupled to the bitline decoder and the plurality of predetermined memory arrays for providing the memory operation signal to the bitline decoder and performing the memory operation on selected memory cells in the one or more of the plurality of predetermined memory arrays in accordance with the memory operation signal.

10. The semiconductor memory device in accordance with claim 9 wherein the bitline decoder raises a voltage potential of gates of the sector select transistors of the plurality of predetermined memory arrays and the bit line select transistors of the selected rows of the selected ones of the plurality of predetermined memory arrays to the first voltage potential when precharging the bitlines.

11. The semiconductor memory device in accordance with claim 10 wherein the bitline decoder further raises a voltage potential of sources of the sector select transistors of the plurality of predetermined memory arrays and the bit line select transistors of the selected rows of the selected ones of the plurality of predetermined memory arrays to a voltage level determined in response to the first voltage potential and a threshold voltage level of the sector select transistors when precharging the bitlines.

12. The semiconductor memory device in accordance with claim 9 wherein the bitline decoder, after the controller signals that the memory operation on the selected memory cells has been completed, discharges the selected rows to a second voltage potential less than the first voltage potential and then connects the sector select transistors to a ground voltage potential.

13. The semiconductor memory device in accordance with claim 9 wherein the memory operation is selected from a group of semiconductor memory operations comprising a memory read operation, a memory read-verify operation, and a program operation.

14. The semiconductor memory device in accordance with claim 9 wherein the plurality of memory arrays comprises a plurality of memory core cell arrays.

15. The semiconductor memory device in accordance with claim 14 wherein the plurality of memory core cell arrays comprises a plurality of predetermined memory sectors.

16. The semiconductor memory device in accordance with claim 9 wherein the semiconductor device is a Flash memory device, and wherein the plurality of memory arrays of the Flash memory device comprise a plurality of core cell arrays, each memory cell of the plurality of core cell arrays storing one or more bits of information.

17. An electronic device comprising:
   a device controller for generating a memory operation signal; and
   a semiconductor memory device coupled to the device controller and performing a memory operation in response to the memory operation signal, wherein the semiconductor memory device comprises:
      a plurality of predetermined memory arrays;
      a bitline decoder coupled to the plurality of predetermined memory arrays and including a plurality of sector select transistors, wherein the bitline decoder determines selected ones of the plurality of predetermined memory arrays and selected rows and unselected rows within the selected ones of the plurality of predetermined memory arrays in response to a memory operation signal received thereby, and wherein the bitline decoder precharges bitlines of the plurality of predetermined memory arrays to a first voltage potential and, after precharging to the first voltage potential, shuts off the sector select transistors of unselected ones of the plurality of predetermined memory arrays and the unselected rows of the selected ones of the plurality of predetermined memory arrays while maintaining the sector select transistors of the selected rows of the selected ones of the plurality of predetermined memory arrays at the first voltage potential; and
      a memory controller coupled to the device controller for receiving the memory operation signal therefrom and coupled to the bitline decoder and the plurality of predetermined memory arrays for providing the memory operation signal to the bitline decoder and performing the memory operation on selected memory cells in the one or more of the plurality of predetermined memory arrays in accordance with the memory operation signal.

18. The electronic device in accordance with claim 17 wherein the bitline decoder raises a voltage potential of gates of the sector select transistors of the plurality of predetermined memory arrays and the bit line select transistors of the selected rows of the selected ones of the plurality of predetermined memory arrays to the first voltage potential when precharging the bitlines.

19. The semiconductor memory device in accordance with claim 18 wherein the bitline decoder further raises a voltage potential of sources of the sector select transistors of the plurality of predetermined memory arrays and the bit line select transistors of the selected rows of the selected ones of the plurality of predetermined memory arrays to a voltage level determined in response to the first voltage potential and a threshold voltage level of the sector select transistors when precharging the bitlines.

20. The semiconductor memory device in accordance with claim 17 wherein the bitline decoder, after the controller signals that the memory operation on the selected memory cells has been completed, discharges the selected rows to a second voltage potential less than the first voltage potential and then connects the sector select transistors to a ground voltage potential.

* * * * *